US012578530B2

(12) United States Patent
Aliane et al.

(10) Patent No.: US 12,578,530 B2
(45) Date of Patent: Mar. 17, 2026

(54) CURRENT-ASSISTED PHOTONIC DEMODULATOR INCLUDING DOPED MODULATION AND COLLECTION REGIONS ARRANGED VERTICALLY AND LOCATED IN A COMPRESSIVE ZONE

(71) Applicant: COMMISSARIAT À L'ENERGIE ATOMIQUE ET AUX ÉNERGIES ALTERNATIVES, Paris (FR)

(72) Inventors: Abdelkader Aliane, Grenoble (FR); Hacile Kaya, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 248 days.

(21) Appl. No.: 18/535,194

(22) Filed: Dec. 11, 2023

(65) Prior Publication Data

US 2024/0192440 A1      Jun. 13, 2024

(30) Foreign Application Priority Data

Dec. 12, 2022      (FR) ...................................... 2213208

(51) Int. Cl.
| | |
|---|---|
| *G02B 6/122* | (2006.01) |
| *G02B 6/134* | (2006.01) |
| *H10F 30/221* | (2025.01) |
| *H10F 30/26* | (2025.01) |

(Continued)

(52) U.S. Cl.
CPC ........... *G02B 6/1225* (2013.01); *G02B 6/134* (2013.01); *H10F 30/221* (2025.01); *H10F*

*30/26* (2025.01); *H10F 71/1212* (2025.01); *H10F 71/1215* (2025.01); *H10F 77/93* (2025.01)

(58) Field of Classification Search
CPC ........... G02F 2/00; H01F 30/24; H01F 77/306
See application file for complete search history.

(56) References Cited

U.S. PATENT DOCUMENTS

| | | | | |
|---|---|---|---|---|
| 8,129,813 B2 * | 3/2012 | Herz | ......................... | G01V 8/12 |
| | | | | 257/80 |
| 10,741,598 B2 * | 8/2020 | Na | .......................... | G01S 17/36 |
| 11,508,870 B2 | 11/2022 | Aliane | | |

(Continued)

FOREIGN PATENT DOCUMENTS

| | | |
|---|---|---|
| FR | 3 080 489 A1 | 10/2019 |
| WO | 2022/123985 A1 | 6/2022 |

OTHER PUBLICATIONS

Gian-Franco Dalla Betta, et al., Design and Characterization of Current-Assisted Photonic Demodulators in 0.18-μm CMOS Technology, IEEE Transaction on Electron Devices, vol. 58, No. 6, Jun. 2011, pp. 1702-1709.

(Continued)

*Primary Examiner* — Daniel Petkovsek
(74) *Attorney, Agent, or Firm* — McDonald Hopkins LLC

(57) ABSTRACT

A current-assisted photonic demodulator, including a detection portion produced based on germanium, containing at least two doped modulation regions and at least one doped collection region, surrounded by a peripheral lateral portion generating in the detection portion horizontal tensile and vertical compressive mechanical stress. The doped collection region(s) are disposed according to a vertical arrangement in relation to the doped modulation regions.

16 Claims, 6 Drawing Sheets

(51) Int. Cl.
  *H10F 71/00*     (2025.01)
  *H10F 77/00*     (2025.01)

(56)                References Cited

U.S. PATENT DOCUMENTS

| | | | |
|---|---|---|---|
| 12,013,463 B2 * | 6/2024 | Cheng | G01S 17/894 |
| 2017/0332024 A1 * | 11/2017 | Feick | H10F 39/80373 |
| 2021/0111205 A1 | 4/2021 | Abdelkader et al. | |
| 2024/0176207 A1 * | 5/2024 | Aliane | H10F 30/24 |

OTHER PUBLICATIONS

Van Nieuwenhove, et al., "Novel Standard CMOS Detector using Majority Current for guiding Photo-Generated Electrons towards Detecting Junctions", In 2005 IEEE/LEOS Symposium Benelux Chapter (Annual IEEE/LEOS Symposium Benelux Chapter)., (2005), Annual IEEE/LEOS Symposium Benelux Chapter.

J. M. Hartmann, et al., "Assessment of the growth/etch back technique for the production of Ge strain-relaxed buffers on Si"., Journal of Crystal Growth, 2018, 488, pp. 43-50.

Search Report for French Application No. 2213208 dated Jun. 7, 2023.

* cited by examiner

CURRENT-ASSISTED PHOTONIC DEMODULATOR INCLUDING DOPED MODULATION AND COLLECTION REGIONS ARRANGED VERTICALLY AND LOCATED IN A COMPRESSIVE ZONE

TECHNICAL FIELD

The field of the invention is that of current-assisted photonic demodulators (CAPDs) adapted to detect light radiation in the near infrared. The invention finds an application in particular in telemetry, biological analysis and industrial inspection (contactless detection of surface defects).

PRIOR ART

Current-assisted photonic demodulators are photodetectors wherein the distribution of a drift electric field is modulated. They were initially described in particular in the scientific article by Van Nieuwenhove et al. entitled *Novel Standard CMOS Detector using Majority Current for guiding Photo-Generated Electrons towards Detecting Junctions*, Proc. Symp. IEEE/LEOS Benelux Chapter, pp. 229-232, 2005. This type of optoelectronic device is particularly used in telemetry for measuring time of flight (TOF).

Such a demodulator normally includes a detection portion produced based on a lightly p-doped semiconductor material that has, on one of its faces, two p+ doped regions for generating and modulating a drift current, and two n+ doped regions located in proximity to the p+ doped regions for collecting the photocurrent. An electrical potential difference is applied between the p+ doped regions, which generates a drift electric field in the detection portion. Thus, when light radiation is absorbed in the detection portion, an electron-hole pair is generated, then the photogenerated hole propagates under the effect of the drift field in the direction of the p+ doped region having the lowest electrical potential, whereas the photogenerated electron is directed in the direction of the opposite p+ doped region, and is then collected by the adjacent n+ doped region. Thus, the photocurrent (minority electrons) can be measured effectively by the demodulator.

Because of the separation between the current of the majority holes and the photocurrent (minority electrons), the contribution of the current of the majority holes to the shot noise and to the thermal noise is thus limited. However, there is a need for such a current-assisted photonic demodulator, adapted to detect in the near infrared, while having good performances.

DESCRIPTION OF THE INVENTION

The aim of the invention is that of providing a current-assisted photonic demodulator, adapt to detect in the near infrared with a cutoff wavelength greater than 1.55 µm, and having a reduced dark current. Such a demodulator can then have good performances, in particular in terms of AC demodulation contrast and bandwidth.

For this purpose, the invention relates to a current-assisted photonic demodulator adapted to detect light radiation of interest, including:
- a detection portion, having a first face and a second face opposite one another and parallel with a main plane, and including a central incident light radiation detection zone. The detection portion is made of a first germanium-based crystalline semiconductor material, and includes doped regions, of which: at least two p-doped modulation regions, and intended to generate and modulate a drift current in the detection portion; and at least one n-doped collection region, and intended to collect the minority charge carriers photogenerated during the absorption of the light radiation of interest;
- a dielectric passivation layer, produced based on an electrically insulating material, and covering the first face; and electrodes, located at the first face and passing through the dielectric passivation layer, of which modulation electrodes in electrical contact with the doped modulation regions; and at least one collection electrode in electrical contact with at least the doped collection region.

According to the invention, the photonic demodulator includes a peripheral lateral portion, surrounding the detection portion in the main plane, produced based on a second material having a coefficient of thermal expansion less than that of the first material, the detection portion then having tensile mechanical stress in the main plane and compressive mechanical stress in a vertical axis orthogonal to the main plane.

Furthermore, said doped regions are disposed according to a vertical arrangement such that: at least one region doped according to a first type of conductivity, referred to as upper doped region, is flush with the first face and is located in the vicinity of the central zone; and at least two regions doped according to a second type of conductivity opposite the first type, referred to as lower doped regions, are located at a distance along the vertical axis from the upper doped region.

It is understood that the lower doped regions are located on the side of the second face whereas the upper doped region is flush with the first face. Preferably, the lower doped regions are closer to the second face than the first face. The lower doped regions are separated from the upper doped region by the intermediate region, which is non-intentionally doped or lightly doped, and forms the main absorption region of the light radiation to be detected.

Some preferred yet non-limiting aspects of this photonic demodulator are as follows.

Each lower doped region can extend parallel with the main plane towards the central zone and the upper doped region, and has a distal end distant from the central zone and a proximal end oriented towards the central zone.

The demodulator can include conductive vias extending along the vertical axis of the first face and in electrical contact with the lower doped regions.

The conductive vias can be distinct from the peripheral lateral portion.

Alternatively, the conductive vias can be parts, mutually distinct, of the peripheral lateral portion, which is then made of an electrically conductive material.

The electrode(s) in contact with the upper doped region(s) can be closer to the central zone, in the main plane, than the electrodes in contact with the conductive vias.

The demodulator can include two lower doped modulation regions, and can include a single upper doped collection region, located in the central zone and at a distance, in the main plane, from the lower doped modulation regions.

The demodulator can include two upper doped regions, each located perpendicular to one of the lower doped regions.

For an upper doped region and a vertically adjacent lower doped region, a vertical distance, along the vertical axis, between said doped regions can be less than a horizontal distance, in the main plane, between the electrode connected to the upper doped region and the electrode connected to the conductive via of the adjacent lower doped region.

The upper doped region(s) can be collection regions, and the lower doped regions can then be modulation regions.

The peripheral lateral portion can be produced based on silicon. The detection portion can then include a lateral zone produced based on SiGe, located at the interface with the peripheral lateral portion.

The invention also relates to a method for manufacturing a photonic demodulator according to any one of the preceding features, including the following steps:

producing, by epitaxy from a support layer, a first layer based on doped germanium;
 producing lower doped regions by localised etching of the first layer based on doped germanium;
 producing by epitaxy a main layer based on non-intentionally doped germanium, on or in contact with the lower doped regions;
 producing a trench through the main layer surrounding the detection portion;
 producing the peripheral lateral portion in the trench, at a temperature greater than ambient temperature, such that, after returning to ambient temperature, the detection portion is tensile in the main plane and compressive along the vertical axis;
 producing one or more upper regions in the detection portion;
 depositing a dielectric passivation layer on the detection portion;
 producing modulation electrodes and collection electrodes.

The method can include, before producing the trench, a step of producing two first notches opening onto the lower doped regions, followed by a step of producing conductive vias in the first notches.

The method can be such that, when producing the trench, it opens onto the lower doped regions, in such a way that the peripheral lateral portion is then in contact with them.

The upper doped region(s) can be produced by localised ion implantation.

BRIEF DESCRIPTION OF THE DRAWINGS

Other aspects, aims, advantages and features of the invention will become more apparent upon reading the following detailed description of preferred embodiments thereof, given as a non-limiting example, and made with reference to the appended drawings, wherein.

DETAILED DESCRIPTION OF PARTICULAR EMBODIMENTS

Figure 1A:
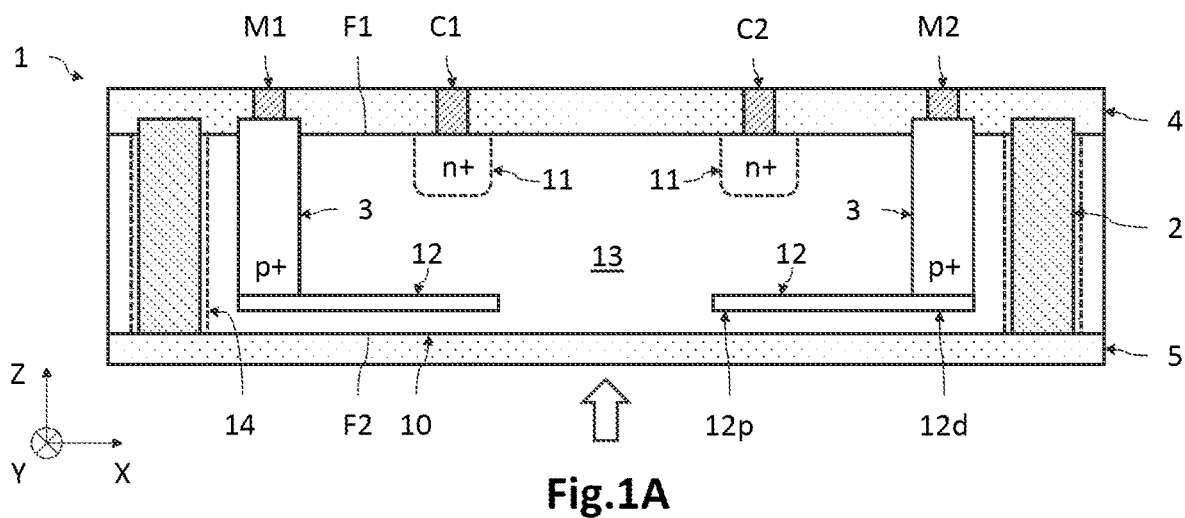
FIG. 1A and FIG. 1B are schematic and partial views, in cross-section (FIG. 1A) and in a top view (FIG. 1B), of a current-assisted photonic demodulator according to an embodiment.

In the figures and in the remainder of the description, the same references represent identical or similar elements. In addition, the different elements are not shown to scale so as to promote clarity of the figures. Moreover, the different embodiments and variants are not mutually exclusive and could be combined together. Unless indicated otherwise, the terms "substantially", "approximately", "in the order of" mean within a 10% margin, and preferably within a 5% margin. Moreover, the terms "between . . . and . . . " and equivalents mean that the bounds are included, unless stated otherwise.

The invention relates to a current-assisted photonic demodulator, adapted to detect a light radiation in the near infrared spectral band (SWIR) corresponding to the spectral range from 0.8 $\mu$m to 1.7 $\mu$m approximately, or to 2.5 $\mu$m approximately. Moreover, it belongs preferably to an array photodetector including an array of detection pixels identical to each other, where each detection pixel includes a planar demodulator.

As a general rule, the demodulator includes:

a detection portion, produced based on germanium, of which a said central zone is the main absorption location of the light radiation to be detected. It extends vertically between a top face F1 and a bottom face F2, and horizontally in the main plane XY. It includes: at least two p-doped modulation regions, adapted to generate and to modulate the drift current; and at least one n-doped collection region, adapted to collect the photogenerated minority carriers;
 a dielectric passivation layer, made of at least one electrically insulating material, which covers the top face F1;
 electrodes located at the top face F1 and passing through the dielectric passivation layer, of which modulation electrodes M1, M2 in electrical contact with the doped modulation regions; and at least one collection electrode C1, C2 in electrical contact with the doped collection region(s).

According to the invention, as detailed hereinafter, the detection portion based on germanium has tensile mechanical stress in the main plane XY, and compressive mechanical stress oriented towards the vertical axis Z. This horizontal tensile stress of the germanium of the detection portion enables the demodulator to detect in the near infrared spectral band up to a cutoff wavelength greater than 1.55 $\mu$m (relaxed germanium cutoff wavelength value). Furthermore, through the Poisson effect, the detection portion undergoes vertical compression.

To generate this mechanical stress, the demodulator includes a peripheral lateral portion, produced based on a material of which the coefficient of thermal expansion is less than that of the material of the detection portion, and which surrounds the detection portion on the plane XY. Thus, following the production of the peripheral lateral portion, the mechanical stress is generated in the detection portion.

Furthermore, the vertical compression of the detection portion is used to enhance the performances of the demodulator. For this, instead of disposing the doped collection region(s) in a coplanar manner to the doped modulation regions, as in the prior art, they are arranged according to a vertical configuration, while retaining an electric polarisation from the same top face F1. More specifically, the doped regions are arranged as follows:

at least one doped region is flush with the top face F1 and is located in the vicinity of the central zone. It is then referred to as 'upper doped region'. The upper doped region(s) are doped according to a first type of conductivity;

at least two doped regions are located at a distance along the vertical axis Z from the upper doped region(s). They are then referred to as 'lower doped regions'. Thus, the upper doped region(s) are located along the vertical axis Z above the lower doped regions. They are doped according to a second conductivity type, opposite the first type. The lower doped regions are in electrical contact with the corresponding electrodes by means of conductive vias, which can be, either distinct from the peripheral lateral portion, or parts of the peripheral lateral portion.

Thus, this vertical arrangement of the doped collection and modulation regions, within a vertical compressive detection portion, makes it possible in particular to reduce the dark current between the doped collection region(s) and the doped modulation regions, on account of the increase in the indirect forbidden band energy of the detection portion, thus enhancing the performances of the demodulator. Furthermore, it is possible to reduce the distance (vertical) between the doped collection region(s) and the doped modulation regions, which helps thus enhance the AC demodulation contrast and the bandwidth. In the case of an array photodetector, it is then possible to reduce the pixel pitch, thus enhancing the resolution of the array photodetector.

As a general rule, the doped collection region(s) can be the upper doped regions, and the doped modulation regions are then the lower doped regions. The reverse configuration is possible, where the doped collection regions are the lower doped regions, and the doped modulation regions are the upper doped regions.

Figure 1B:
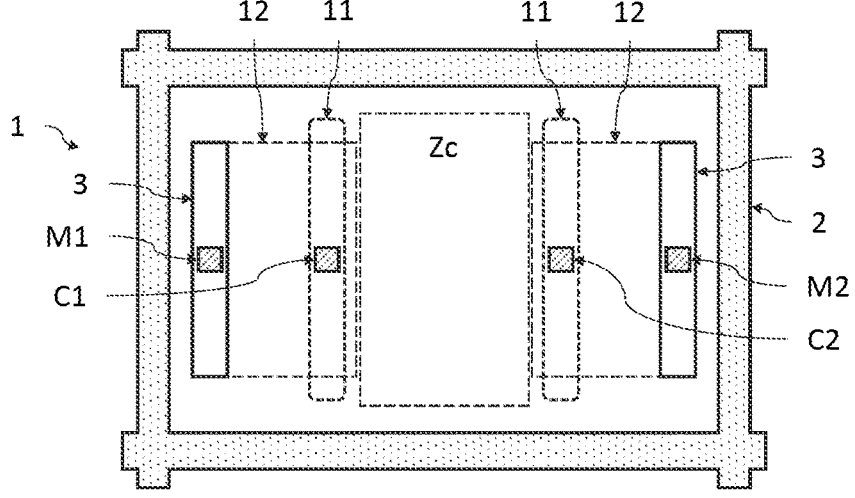

FIGS. 1A and 1B are schematic and partial views, in cross-section (FIG. 1A) and in a top view (FIG. 1B), of a current-assisted photonic demodulator 1 according to one embodiment, belonging here to an array of identical planar demodulators 1.

In this example, the detection portion 10 includes two upper doped regions 11 which are here n+ doped collection regions, and two lower doped regions 12 which are then p+ doped modulation regions. Moreover, the doped modulation regions are connected to the modulation electrodes M1 and M2 by specific conductive vias 3 (therefore distinct from the peripheral lateral portion 2) and produced based on germanium. Moreover, the lower face F2 is that which receives here the light radiation to be detected.

A three-dimensional direct reference frame XYZ is defined here and for the following description, where the axes X and Y are parallel to the main plane of the demodulators 1, and where the vertical direction +Z is oriented along the thickness of the detection portion 10 of the demodulator 1, from the lower face F2 in the direction of the top face F1. The terms "lower" and "upper" refer to an increasing positioning in the direction +Z defined in FIG. 1A. Moreover, the term "horizontal" refers to an orientation parallel to the plane XY and the term "vertical" refers to an orientation parallel to the axis Z.

Figure 3A:
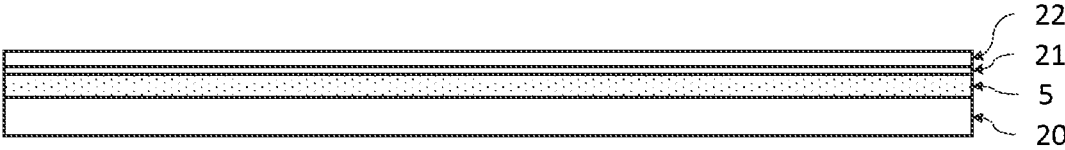
FIGS. 3A to 3L illustrate different steps of a method for manufacturing a demodulator similar to that of FIG. 1A.
Figure 3B:
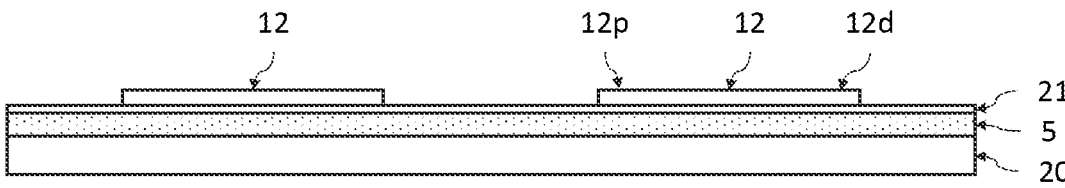
Figure 3C:
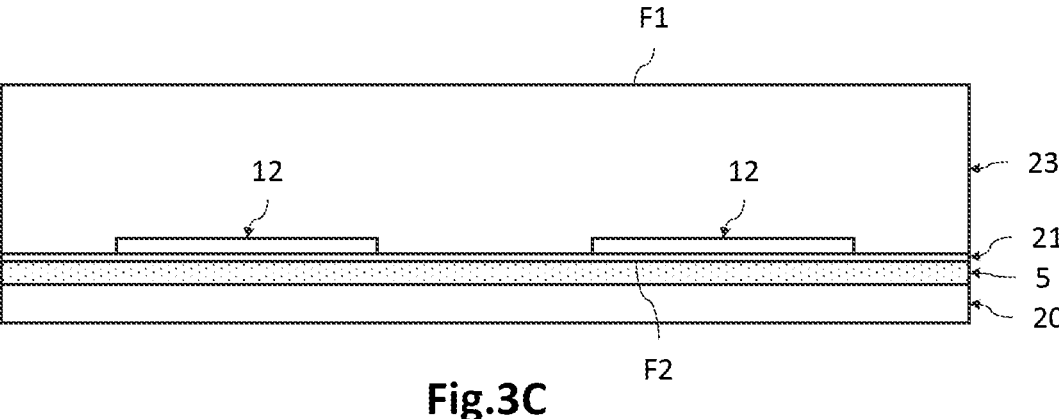

In this example, the demodulators 1 have a planar configuration since they are produced here from the same main semiconductor layer 23 (cf. FIG. 3C). The latter extends in a main plane XY between the upper F1 and lower F2 faces opposite each other and parallel with the main plane. The two faces F1, F2 therefore extend along identical planes for each of the demodulators 1, and vertically delimit (along the thickness axis Z) the detection portions 10 of the demodulators 1. Thus the demodulators 1 do not have a mesa structure since they are produced here from the same main semiconductor layer 23.

Each demodulator 1 includes a detection portion 10 produced based on germanium, and therefore adapted to detect light radiation in the near infrared (SWIR). Insofar as the detection portion 10 is produced based on germanium and is subjected to tensile mechanical stress in the plane XY, the demodulator 1 is adapted to detect a light radiation at a cutoff wavelength greater than 1.55 μm.

The thickness of the detection portion 10, defined along the vertical axis Z between the upper F1 and lower F2 faces, is here substantially constant from one demodulator 1 to the other, for example is between a few hundreds of nanometres and a few microns, for example between approximately 1 μm and 5 μm. The thickness is selected so as to obtain a good absorption in the range of wavelengths of the light radiation to be detected. The detection portion 10 has a transverse dimension in the plane XY that can be between a few hundreds of nanometres and a few tens of microns, for example between approximately 1 μm and 20 μm, for example equal to 10 μm.

The detection portion 10 is produced based on germanium, i.e. the semiconductor material or materials are germanium or a compound (binary or ternary etc.) formed from at least germanium. Thus the detection portion 10 can be made for example of germanium Ge, of silicon germanium SiGe, of germanium tin GeSn, or even of silicon germanium tin SiGeSn. It can thus be made of the same semiconductor material and have regions with different conductivity types (homojunction) so as to form a pn or pin junction. It can in a variant be a stack of sublayers of various semiconductor materials (heterojunction), which are then formed based on germanium.

The detection portion 10 includes an intermediate region 13, not intentionally doped (with an optional residual p doping) or lightly p doped. The intermediate region 13 extends between the faces F1 and F2, as well as in the plane XY, and forms the main region absorbing the light radiation to be detected.

A central zone Zc of the detection region 10 is defined as being the main absorption location of the light radiation to be detected. This central zone Zc is advantageously delimited in the plane XY by an optical cover on the side of the face F1 or F2 which receives the light radiation to be detected. Preferably, the light radiation to be detected is incident on the side of the lower face F2 (referred to as front face), the lower doped regions 12 can then form this optical cover and thus help define the optical window of the demodulator 1, in particular when they are p-doped with boron (modulation), as explained hereinafter.

The upper doped regions 11 are therefore here n-doped regions, preferably n+ doped. They are adapted to collect the photogenerated monitory carriers (photocurrent) obtained from the absorption of the light radiation to be detected in the central zone Zc of the detection portion 10 (in the intermediate region 13), via the electrical potential applied thereto by the collection electrodes C1 and C2. They are here n+ doped, and can have a doping that can be between approximately $5 \times 10^{18}$ and $2 \times 10^{20}$ at/cm³.

The upper doped regions 11 are flush with the top face F1 and are located in the vicinity of the central zone Zc. Being flush with means "arriving at", or "extends from". They extend along the vertical axis Z over a predefined depth. Also, each upper doped region 11 is here surrounded in the plane XY and along the direction −Z by the intermediate region 13. It opens directly onto the top face F1, without being spaced apart by a zone of the intermediate region 13.

The two upper doped regions 11 are disposed in the plane XY on either side of the central zone Zc, and in the vicinity thereof. Thus, the collection electrodes C1 and C2 are located in the vicinity of the central zone Zc, whereas the modulation electrodes M1 and M2 are distant therefrom. More generally, the electrodes of the upper doped regions 11 are located in the vicinity of the central zone Zc, whereas the electrodes of the lower doped regions 12 are distant from the central zone Zc.

Note that the upper doped regions 11 are here produced by localised ion implantation in the detection portion 10 from the top face F1. Alternatively, they can be produced by doping with growth during epitaxial regrowth in notches formed from the top face F1 of the detection portion 10.

The lower doped regions 12 are here p-doped regions, preferably p+ doped. They are adapted to generate and modulate the drift current via the electrical potential that is imposed on them by the modulation electrodes M1 and M2. They are here p+ doped, and have for example a doping of between approximately $10^{18}$ and $10^{20}$ at/cm$^3$, preferably $10^{19}$ at/cm$^3$.

The lower doped regions 12 are located at a distance along the vertical axis Z from the upper doped regions 11. In other words, the upper doped regions 11 are located along the vertical axis Z above the lower doped regions 12 (optionally with overlapping thereof). The lower doped regions 12 are therefore spaced apart from the upper doped regions 11 by a zone of the intermediate region 13 in vertical compression. Moreover, the lower doped regions 12 are here spaced apart from the bottom face F2 by a non-zero distance, but alternatively, they could be flush with the bottom face F2 (cf. variants of FIGS. 2A and 2B).

The lower doped regions 12 are located in the plane XY on either side of the central zone Zc of the detection portion 10. Also, the electrodes (here M1 and M2) of the lower doped regions 12 are more distant from the central zone Zc than those of the upper doped regions 11.

The lower doped regions 12 extend parallel with the plane XY towards the central zone Zc and the upper doped regions 11, between a distal end 12d (i.e. distant from the central zone) and a proximal end 12p (i.e. close to the central zone). The terms 'distal' and 'proximal' are defined in relation to the central zone Zc. The distal end 12d is the zone of the electrical connection to a modulation electrode, here by means a specific conductive via 3, whereas the proximal end 12p is the main drift current generation zone.

In this example, the lower doped regions 12 extend in the plane XY towards the central zone Zc up to the perpendicular to the upper doped regions 11. In other words, in projection in the plane XY, there is overlap of at least a part of the lower doped region 12 by the adjacent upper doped region 11. Alternatively, as illustrated in FIG. 2B, the lower doped regions 12 may not be perpendicular to the upper doped regions 11.

Note that the lower doped regions 12 are produced by doping with growth during epitaxial regrowth taking place when producing the detection portion 10. Each lower doped region 12 has the same predefined thickness along the vertical axis Z, and substantially constant in the plane XY, for example equal to some tens or hundreds of nanometres. The thickness is here equal to approximately 200 nm, but it can be between 100 and 500 nm.

The lower doped regions 12 (here modulation) are electrically connected to the electrodes (here M1, M2) by means of conductive vias 3 which extend along the vertical axis Z between the relevant electrodes and the distal end 12d of the lower doped regions 12. In this example, the conductive vias 3 are distinct from the peripheral lateral portion 2. They are made of at least one electrically conductive material, here of a material based p-doped germanium, deposited in notches 24 formed in the main semiconductor layer 23 (cf. FIG. 3F) from the top face F1 and opening onto the lower doped regions 12.

The detection portion 10 is delimited laterally, in the plane XY, by a peripheral lateral portion 2, produced based on a material which has a coefficient of thermal expansion less than that of the material based on germanium of the detection portion 10. The material is preferably based on silicon, and is preferably polysilicon. It can also consist of monocrystalline silicon, amorphous silicon, or silicon-germanium. The material can optionally be doped. The peripheral lateral portion 2 surrounds the detection portion 10 in the plane XY, either continuously (cf. FIG. 1B), or discontinuously (cf. FIG. 2C).

On account of the thermal expansion differential, following the production of the peripheral lateral portion 2 by deposition at a temperature greater than ambient temperature, for example by epitaxy at a temperature between 500° C. and 700° C., the detection portion 10 has horizontal tensile mechanical stress, and through the Poisson effect, vertical compressive mechanical stress.

The peripheral lateral portion 2 furthermore ensures lateral optical isolation of the demodulators 1 in the plane XY. It preferably extends here over the entire thickness of the detection portion 10 to emerge on the support layer 5.

When the material of the peripheral lateral portion 2 is produced based on silicon, a lateral zone 14 produced based on silicon-germanium can be present between and in contact with the detection portion 10 and the peripheral lateral portion 2. The lateral zone 14 has a forbidden band energy (gap) greater than that of the detection portion 10 made of germanium. This lateral "gap opening" makes it possible to reduce the sensitivity of the demodulator 1 to defects present in the vicinity of the peripheral lateral trench. Thus the performances of the demodulator 1 are also improved.

Moreover, the detection portion 10 rests on a support layer 5. This layer can be made of a semiconductor crystalline material adapted to epitaxy of the germanium of the detection portion 10. This material can be optionally doped. This support layer 5 can be a top layer of an SiGeOi substrate or of a GeOi substrate. It is here made of silicon.

In the case here where the lower doped regions 12 are not in contact with the support layer 5 (cf. FIG. 1A), the material of the support layer 5 can be doped and be carried to an electric potential, for example via the peripheral lateral portion 2. In the opposite case where the lower doped regions 12 are in contact with the support layer 5 (FIG. 2A), the material thereof is non-intentionally doped. Alternatively, the detection portion 10 can rest on a support layer 5 made of an insulating material.

The demodulator 1 includes a dielectric passivation layer 4, made of at least one electrically non-conductive material, such as an insulator or an intrinsic semiconductor. It covers the top face F1 and makes it possible to passivate the detection portion 10 and electrically insulate the electrodes M1, M2, C1, C2. It is thus in contact with the intermediate region 13, upper doped regions 11, conductive vias 3, and the peripheral lateral portion 2. It is preferably made of an oxide, such as silicon, aluminium, germanium, hafnium oxide, etc., or from intrinsic silicon. It has a thickness for example between 2 nm and 500 nm.

The demodulator 1 includes electrodes M1, M2, C1, C2 located on the side of the top face F1, which pass through the dielectric passivation layer 4 and are connected electrically to the upper 11 and lower 12 doped regions. The modulation electrode M1, M2 make it possible to generate and modulate the drift current. They are here in contact with the conductive vias 3, and thus make it possible to apply a positive or zero electric potential at the lower doped regions 12 (here modulation). They are connected to an electrical control circuit. The collection electrodes C1, C2 make it possible to collect the photogenerated electrons (photocurrent). They are here in contact with the upper doped regions 11 (here collection) to apply a positive electric potential to them. They are connected to an electrical reading circuit. As stated above, the electrodes of the lower doped regions 12 are more distant from the central zone Zc than the electrodes of the upper doped regions 11.

The demodulator 1 is thus adapted to detect in the near infrared, with a cutoff wavelength greater than 1.55 μm. This is due to the tensioning in the plane XY of the detection portion 10 based on germanium, which results in a reduction in the optical gap of the material of the detection portion 10. Furthermore, this horizontal tension of the detection portion 10 makes it possible to increase the mobility of the charge carriers, and therefore improves the bandwidth of the demodulator 1.

Furthermore, the vertical compression of the detection portion 10 results in an increase in the indirect gap of the material based on germanium of the detection portion 10, and therefore in a reduction in the dark current between each doped modulation region and the adjacent doped collection region, which are arranged vertically.

It is then possible to reduce the vertical distance between each doped modulation region and the adjacent doped collection region. The AC demodulation contrast and the bandwidth of the demodulator 1 are thus improved, while preventing the risk of an increase in the leakage current. Moreover, it is possible to reduce the pixel pitch, in the case of an array photodetector.

In the case of an illumination on the rear face (bottom face F2), and when the lower doped regions 12 are p+ doped regions (germanium doped for example with boron with a concentration of the order of $10^{19}$ cm$^{-3}$), these same lower doped regions 12 form a reflector and therefore an optical cover defining in the plane XY the optical window and therefore the central zone Zc. It is then not necessary to produce a specific optical cover.

Moreover, it is advantageous to optimise the thickness of the detection portion 10, in order to effectively absorb the infrared light radiation at the desired wavelength, while generating sufficient tensile and compressive mechanical stress.

Figure 1C:
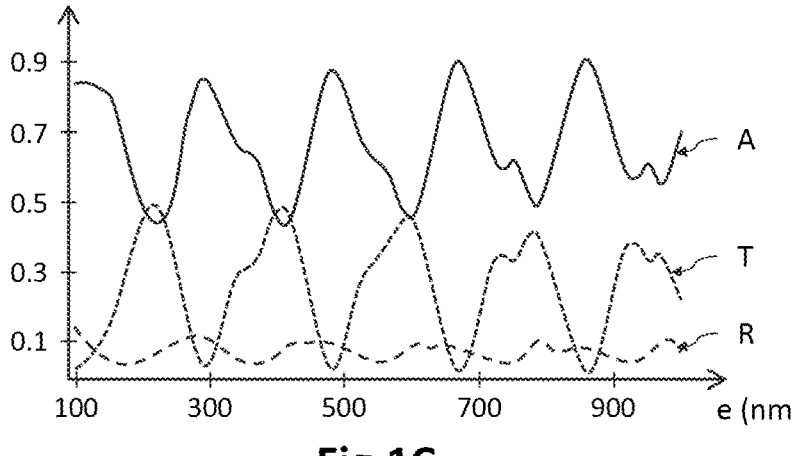
FIG. 1C illustrates a progression of the rates of absorption, transmission and reflection of the detection portion, according to the thickness thereof.

In this respect, FIG. 1C illustrates an example of progression of the rates of absorption A, transmission T and reflection R of the detection portion 10 with respect to a light radiation of wavelength 1.55 μm.

In this example, the dielectric passivation layer 4 is made of SiO$_2$ of 280 nm in thickness, thus making it possible to be a good anti-glare coating. The detection portion 10 is made of germanium, and the intermediate region 13 has a p-doping of the order of approximately 1015 cm$^{-3}$. The lower doped portions 12 (modulation) are made of germanium doped with boron with a concentration of approximately $10^{19}$ cm$^{-3}$ and have a thickness of 200 nm. The upper doped portions 11 (collection) are made of germanium doped with phosphorus (or with arsenic, or antimony) with a concentration of approximately $10^{19}$ cm$^{-3}$. The detection portion 10 has a thickness (between the two faces F1 and F2) which is varied. It is surrounded by a peripheral lateral portion 2 made of polycrystalline silicone.

The rates of absorption A, transmission T and reflection R illustrated in FIG. 1C are obtained by digital simulation of the electromagnetic equations using COMSOL Multiphysics software. The absorption peaks appear to be situated for thicknesses of the detection portion 10 of approximately 300 nm, 480 nm, 670 nm, and 860 nm. Thus, for a thickness of 295 nm, the rate of absorption A is equal to approximately 85%. It rises to approximately 88% for the thickness of 480 nm, and to approximately 90% for the thickness of 670 nm.

Furthermore, the mechanical stress is determined using the same software, for different thickness values of the detection portion 10. Thus, for a thickness of 295 nm, a horizontal tensile deformation of +0.36% is obtained as well as a vertical compressive deformation of −0.14%. For a thickness of 480 nm, +0.30% of horizontal tension, and −0.12% of vertical compression are obtained. And for a thickness of 670 nm, +0.25% of horizontal tension, and −0.11% of vertical compression are obtained. Thus, the mechanical stress decreases as the thickness of the detection portion 10 is increased.

Also, in this example, a thickness of 480 nm appears to be a good compromise between optical absorption and mechanical deformations. It thus makes it possible to obtain a high rate of absorption (here 88%) as well as sufficient mechanical stress (horizontal tension of +0.30%, and vertical compression of −0.12%).

The performances of such a demodulator 1 are particular high, whether in terms of temporal impulse response and bandwidth, insofar as a maximum value of 95% is obtained for the AC demodulation contrast C$_{ac}$, and a bandwidth of the order of 400 to 500 MHz. Here, the doped collection regions (upper regions 11) are carried to an electric polarisation of +1V, and the doped modulation regions (lower regions 12) are carried for one to 0V and the other to +0.7V. In operation, these two modulators are in phase opposition and frequency-modulated.

It should be stated here that the temporal impulse response corresponds to the AC demodulation contrast C$_{ac}$. The contrast C$_{AC}$ is defined by the following equation (simplified here to a two-dimensional configuration): C$_{ac}$ (f)= (Q$_{C1}$(t)−Q$_{C2}$(t))/Q$_{tot}$, where Q$_{C1}$ and Q$_{C2}$ are the electrical charges at the electrodes C1 and C2, and Q$_{tot}$ is the total charge in the demodulator 1. The AC demodulation contrast C$_{ac}$ is a contrast that is extracted from the temporal variation in the currents harvested by the n+ doped collection regions. Integrating these two currents gives the quantities of charges in the demodulator 1. On the other hand, the DC demodulation contrast C$_{dc}$ does not involve the frequency (static contrast).

As described in particular in the scientific article by Dalla Betta et al. entitled *Design and Characterization of Current-Assisted Photonic Demodulators* in 0.18-μm CMOS Technology, IEEE Trans. Electron Devices, vol. 58, no. 6, pp. 1702-1707, June 2011, the demodulation contrast C$_d$ is defined such that: $C_d = f \times_{C1}{}^{ac} \times I_{tot}{}^{ac}/I_{tot}{}^{dc}$, where I$_{tot}$ is the total photocurrent collected at the electrodes C1 and C2: I$_{tot}$=I$_{C1}$+I$_{C2}$; and f$_{C1}$ is the fraction of the photocurrent I$_{tot}$ collected by the electrode C1. In the case where the incident light radiation is modulated sinusoidally in power and the electrical voltage applied between the modulation electrodes M1 and M2 is also sinusoidal (the two modulators are still in mutual phase opposition), with the same frequency as the light radiation, the collected photocurrents can be written thus:

$$I_{C1} = [\tfrac{1}{2} + f_{C1}{}^{ac}\sin(2\pi ft)] \times [I_{tot}{}^{dc} + I_{tot}{}^{ac}\sin(2\pi ft - \varphi)]$$

$$I_{C2} = [\tfrac{1}{2} - f_{C1}{}^{ac}\sin(2\pi ft)] \times [I_{tot}{}^{dc} + I_{tot}{}^{ac}\sin(2\pi ft - \varphi)]$$

where $I_{tot}^{dc}$ and $I_{tot}^{ac}$ are the continuous and alternating components of the measured photocurrent $I_{tot}$, $f_{C1}^{ac}$ is the amplitude of the AC component of the fraction $f_{C1}$, f is the modulation frequency, and $\phi$ is the phase difference between the emitted light and the received light. Using these two equations, it is possible to access the mean of the currents $I_{C1}$ and $I_{C2}$ which directly contain the phase $\phi$ using which a distance of an object located in the illuminated scene can thus be determined. These electric currents make it possible to determine the AC demodulation contrast $C_{ac}$.

Figure 2A:
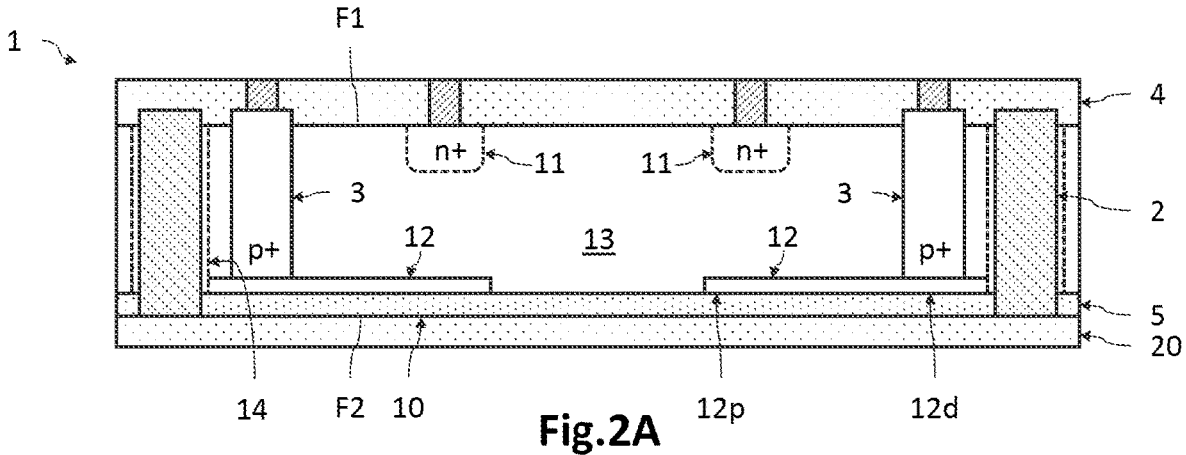
FIG. 2A is a schematic and partial view, in cross-section, of a current-assisted photonic demodulator according to an alternative embodiment.
Figure 2B:
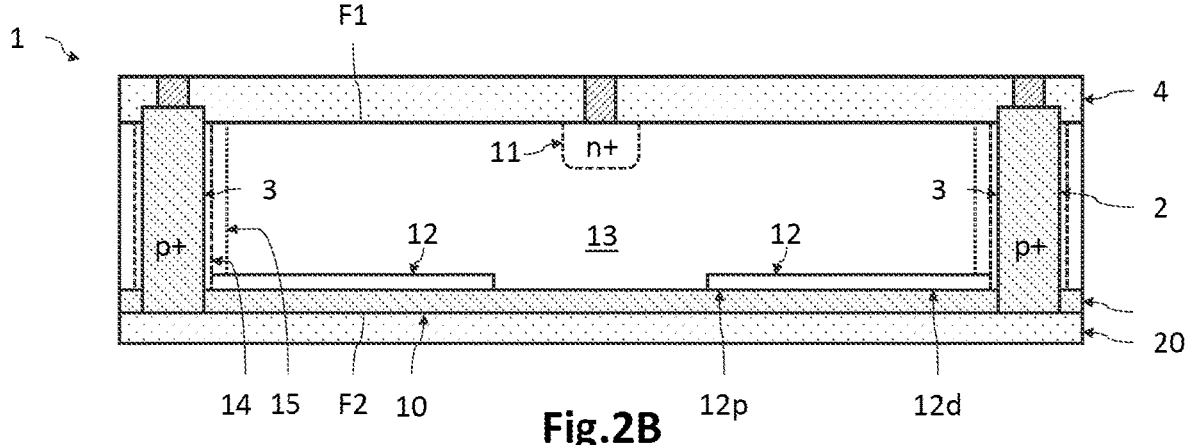
FIG. 2B and FIG. 2C are schematic and partial views, in cross-section (FIG. 2B) and in a top view (FIG. 2C), of a current-assisted photonic demodulator according to another alternative embodiment.

FIG. 2A is a schematic and partial view, in cross-section, of a current-assisted photonic demodulator 1 according to an alternative embodiment.

In this example, the demodulator 1 differs from that of FIG. 1A in that the detection portion 10 has been produced by epitaxy from an SOI substrate. The detection portion 10 is then in contact with a support layer 5 made of silicon, preferably monocrystalline. This support layer 5 is a nucleation layer for the germanium of the detection portion. It rests on an insulating layer 20 made of a silicon oxide (BOX). A thick silicon layer (not shown) can be present in contact with the oxide layer 20. Here, the lower doped regions 12 are in contact with the support layer 5. Also, it is made of non-intentionally doped silicon, so as to prevent any short-circuit between the lower doped regions.

Figure 2C:
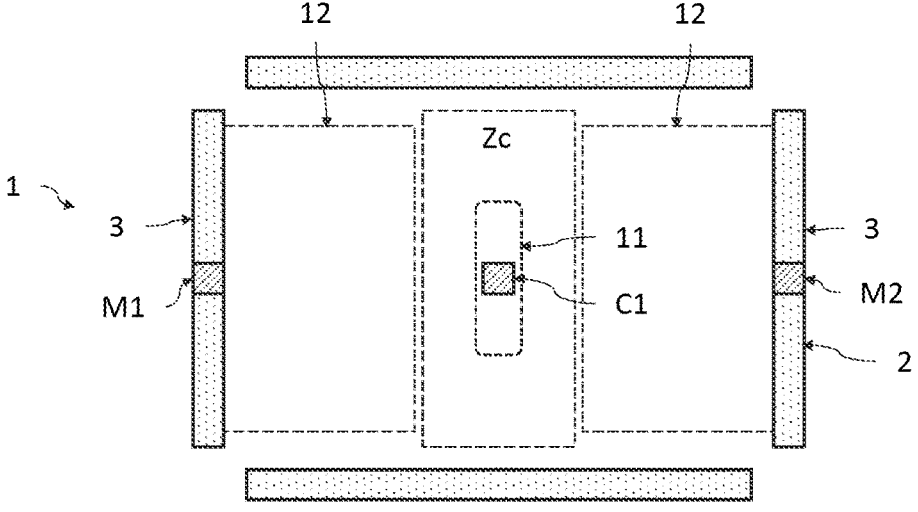

FIGS. 2B and 2C are schematic and partial views, in cross-section (FIG. 2B) and in a top view (FIG. 2C), of a current-assisted photonic demodulator 1 according to another alternative embodiment.

In this example, the demodulator 1 differs from those of FIGS. 1A and 2A in particular in that it only includes a single doped collection region, which is then an upper doped region 11 located at the centre of the central zone Zc. The doped modulation regions are then lower doped regions 12.

Moreover, the conductive vias 3 which provide the electric polarisation of the lower doped regions 12 are not vias distinct from the peripheral lateral portion 2, but are parts (mutually distinct) of the peripheral lateral portion 2. The latter is here formed of a plurality of distinct parts in the plane XY (without material continuity between them). The peripheral lateral portion 2 is made of a doped conductive material of the same type of conductivity as the lower doped regions 12, here p-type. In this example, it is made of p+ doped polycrystalline silicone with a boron concentration of approximately $10^{20}$ cm$^{-3}$. The electrodes are then in contact with the parts of the peripheral lateral portion 2.

A p-doped lateral zone 15 may be present in the detection portion 10, along the peripheral lateral portion 2, when the latter is p-type like here. This p+ doped lateral region 15 makes it possible to avoid the space charge region of the demodulator 1 extending as far as the lateral border of the detection portion 10. Thus the contribution of this region (potentially not free from defects related to the production of the trenches) to the dark current is limited.

FIGS. 3A to 3L illustrate various steps of a method for manufacturing an array of current-assisted photonic demodulators 1 similar to that illustrated in FIG. 1A. The demodulators 1 here have a planar configuration. They are produced based on germanium and therefore adapted to detect infrared radiation in the near infrared. The detection portions 10 are made of germanium. In this example, they are produced from a growth SOI substrate.

With reference to FIG. 3A, a growth SOI substrate is provided, of which the top layer 5 is a layer of monocrystalline silicon of 10 to 100 nm in thickness. A layer 21 of non-intentionally doped germanium (nid) of some tens of nanometres, for example 50 nm, is then produced by epitaxy.

The growth temperature can be 400° C. Then, a layer 22 of p-doped germanium with a concentration of approximately $10^9$ cm$^{-3}$, of a thickness of approximately 200 nm is produced by epitaxy, at a temperature of 400° C.

With reference to FIG. 3B, the lower doped regions 12 are then produced by lithography and localised etching of the p++ doped layer 22, with etch stoppage on the bottom layer 21 of nid germanium. Each lower doped region 12 extends between a proximal end 12p and a distal end 12e in the plane XY. The proximal ends 12p delimit along the axis X the optical window. The dimension along the axis X of the optical window is dependent on the pixel pitch, and can thus range from 1.5 μm to several tens of microns.

With reference to FIG. 3C, the main semiconductor layer 23 is produced by epitaxy from the nid germanium layer 21 and the lower doped regions 12. The main semiconductor layer 23 is made of non-intentionally doped germanium and has a thickness between approximately 700 and 800 nm. It can be produced as described in particular in the publication by Hartmann & Aubin entitled *Assessment of the growth/ etch back technique for the production of Ge strain-relaxed buffers on Si*, Journal of Crystal Growth, 488 (2018), 43. The main semiconductor layer 23 then has a very low density of emergent dislocations (for example of the order of $10^7$ dislocations/cm$^2$), which helps to reduce the dark current in the detection portion 10 of the demodulator 1.

A step of chemical-mechanical planarisation (CMP) is then performed, to planarise the top face F1, and to reduce the thickness of the main semiconductor layer 23 to a pre-determined optimal value (for example equal to approximately 480 nm). The thickness of that which will be the detection portion is defined between the bottom face F2 (interface between the nid germanium layer 21 and the nucleation support layer 5) and the top face F1.

Figure 3D:
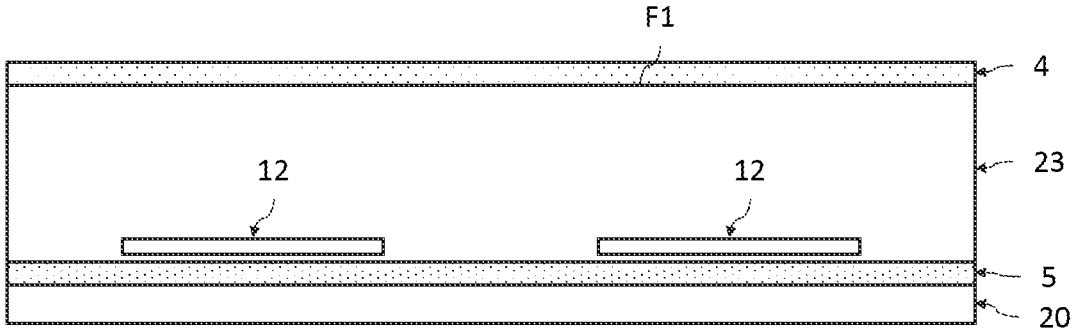

With reference to FIG. 3D, a dielectric passivation layer 4 is deposited on the top face F1 of the main semiconductor layer 23 (the layer 21 is integrated in the layer 23). This dielectric passivation layer 4 can be formed from a first passivation sublayer produced for example from an aluminium oxide deposited by an atomic layer deposition (ALD) with a thickness of the order of 10 to 50 nm, for example 10 nm, or even by a thin layer of non-intentionally doped silicon with a thickness ranging from 1 to 4 nm, deposited by epitaxy on the germanium of the detection portion 10. Then, a second sublayer produced for example from a silicon oxide such as SiO₂ TEOS (tetraethyl orthosilicate) with a thickness of the order of 100 to 500 nm, is deposited on the first underlying sublayer.

Figure 3E:
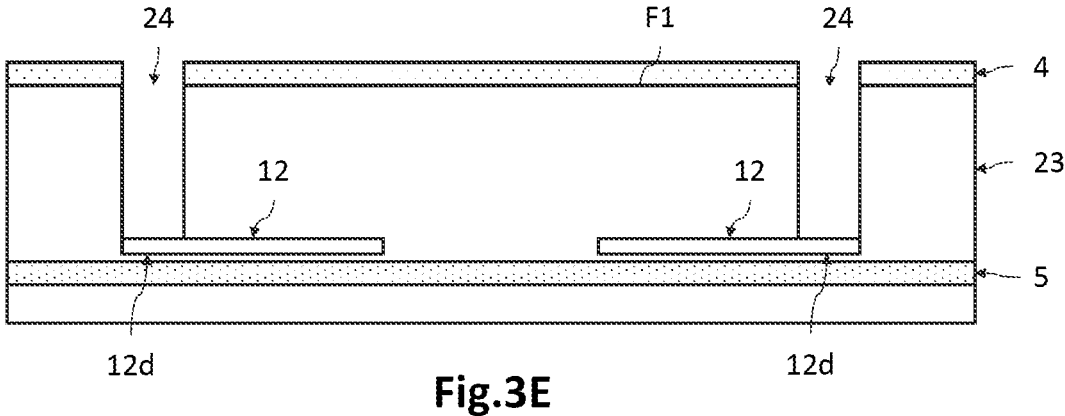

With reference to FIG. 3E, notches 24 are then produced in the main layer 23, extending along the axis Z from the top face F1 to open onto the lower doped regions 12, at the distal ends 12d. These notches 24 are produced by lithography and localised etching, with etch stoppage on the p++ doped germanium of the lower doped regions 12. The transversal dimensions of these notches 24 can be of the order of approximately 0.5 to 1 μm.

Figure 3F:
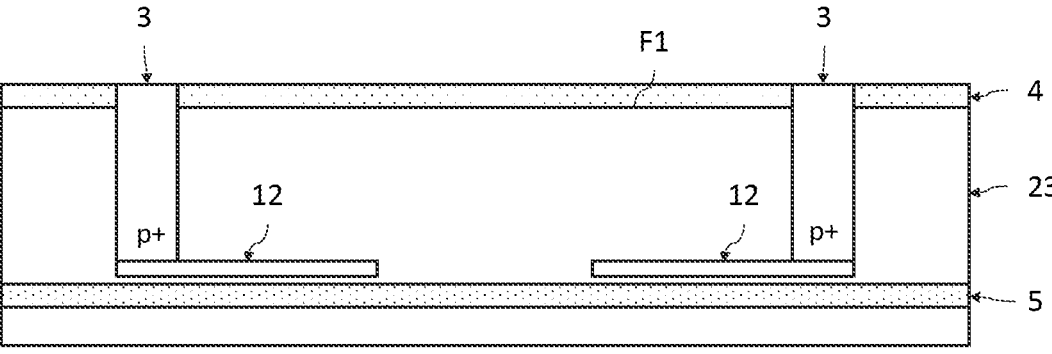

With reference to FIG. 3F, the conductive vias 3 are then produced, by depositing an electrically conductive material in the notches 24. Here, the notches 24 are filled by epitaxy at a temperature of approximately 600° C. with germanium p-doped with boron with a concentration of approximately $10^{19}$ cm$^{-3}$. A step of CMP planarisation is then performed to remove the p+ doped germanium resting on the dielectric passivation layer 4.

Figure 3G:
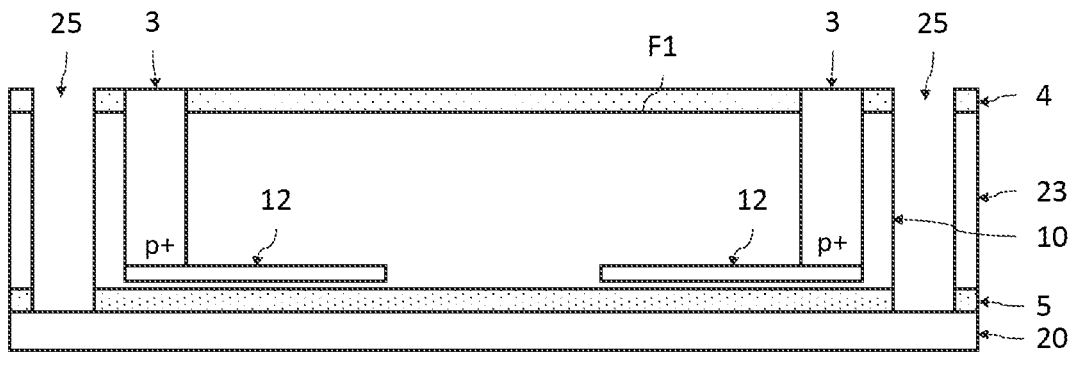

With reference to FIG. 3G, a peripheral trench 25 is then produced in the main layer 23, making it possible to pixelate the demodulators 1 by peripheral lateral portions 2. A localised etching of the main layer 23 is then open here onto the BOX oxide layer 20. Each trench 25 extends here continuously in the plane XY around a detection portion 10. A plurality of detection portions 10 separated from each other by a continuous trench 25 are thus obtained. They are preferably obtained by an anisotropic etching technique, so as to obtain a substantially vertical lateral border along the axis Z. The trenches 25 have a transverse dimension (width) in the plane XY that can be between 0.5 μm and 2 μm, for example equal to 1 μm. The detection portion 10 can thus have a shape in the plane XY for example circular, oval, polygonal, for example square, or any other shape.

Figure 3H:
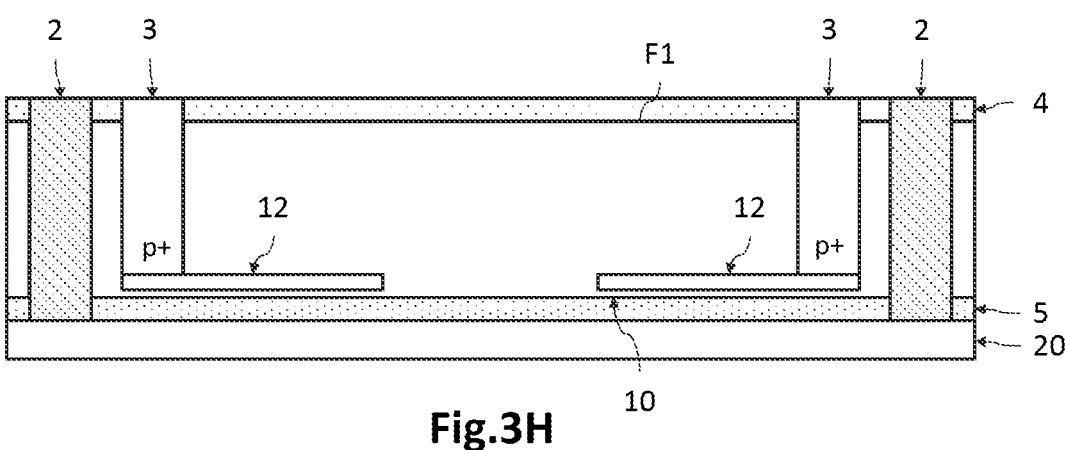

With reference to FIG. 3H, the peripheral lateral portion 2 is produced, by epitaxy in the trenches 25, from a crystalline semiconductor material here based on silicon, at a temperature between 500° C. and 700° C. It consists here of polycrystalline silicon. It can be p-doped, for example with boron with a doping level of the order of $4 \times 10^{19}$ cm$^{-3}$. This material has a coefficient of thermal expansion less than that of the germanium of the detection portion 10, so that, on returning to ambient temperature (after the epitaxy of the polysilicon in the peripheral trench 25), the detection portion 10 has horizontal tensile and vertical compressive mechanical stress.

Figure 3I:
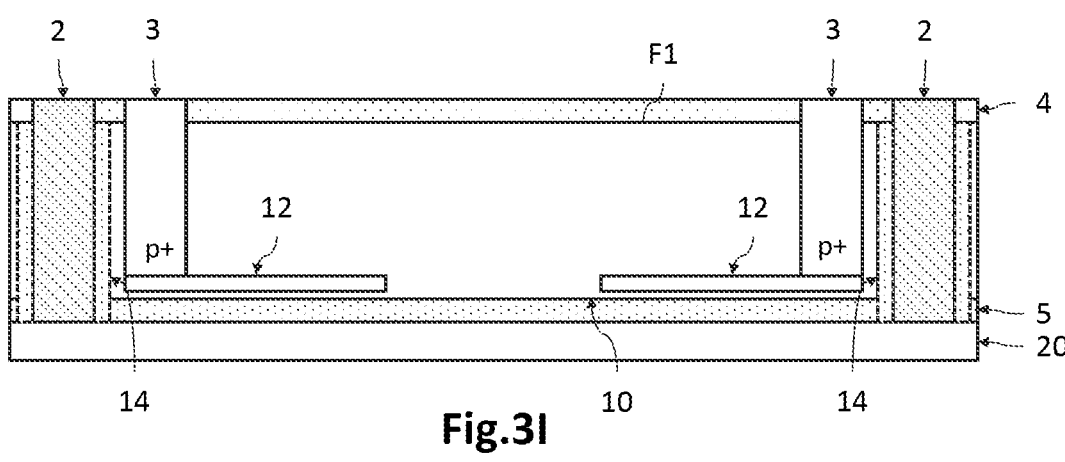

With reference to FIG. 3I, an interdiffusion annealing is performed to form the lateral zone 14 based on SiGe. Finally, a chemical mechanical polishing (CMP) step is then performed, with stoppage on the top face of the dielectric passivation layer 4, to eliminate the excess material based on silicon and to planarise the top face of the stack.

Figure 3J:
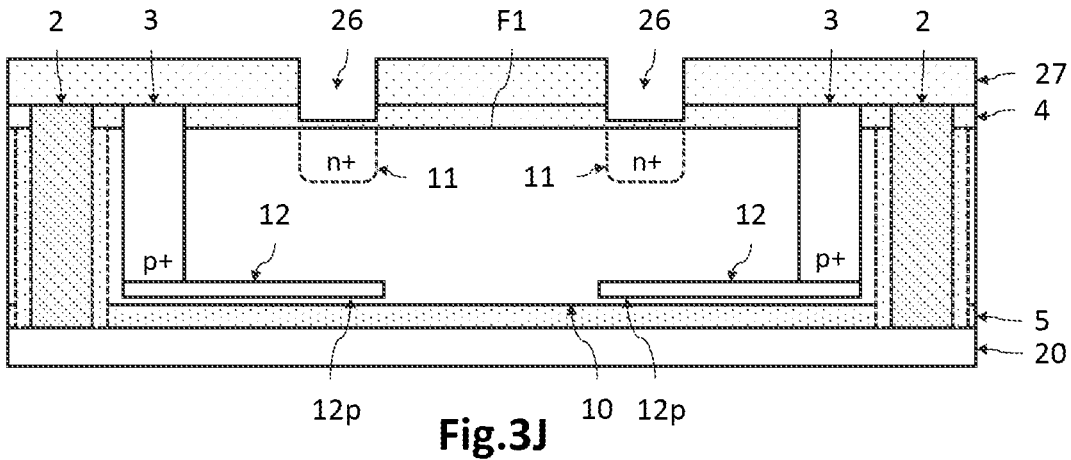

With reference to FIG. 3J, non-through notches 26 are produced in the dielectric passivation layer 4, leaving a non-etched part for example of 20 nm. A resin 27 (implantation mask) is then deposited, leaving the implantation zones defined by the notches 26 free. Then, the upper doped regions 11, here n+ doped, are produced by ion implantation of phosphorus (or even with arsenic or antimony) in the detection portion 10. The doping level can be of the order of $5 \times 10^{18}$ to $10^{20}$ cm$^{-3}$. The upper doped regions 11 are therefore flush with the top face F1 and are located above the lower doped regions 12. Here, they are located perpendicular to the proximal ends 12p of the lower doped regions 12. The resin 27 is then removed, and an activation annealing of the phosphorus is performed.

Note that the upper doped regions 11 can also be produced by epitaxy regrowth of germanium in notches formed in the detection portion 10 from the face F1, with n-doping at growth. However, the ion implantation is preferred so as to keep the mechanical stress present in the detection portion 10.

Figure 3K:
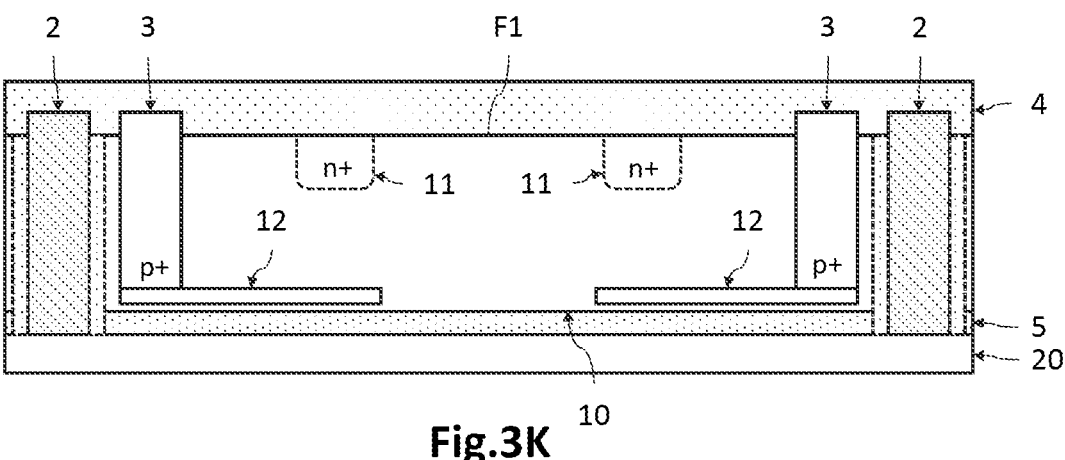

With reference to FIG. 3K, a new dielectric layer is deposited on the underlying dielectric layer 4, so as to cover the detection portion 10, the conductive vias 3 and the peripheral lateral portion 2.

Figure 3L:
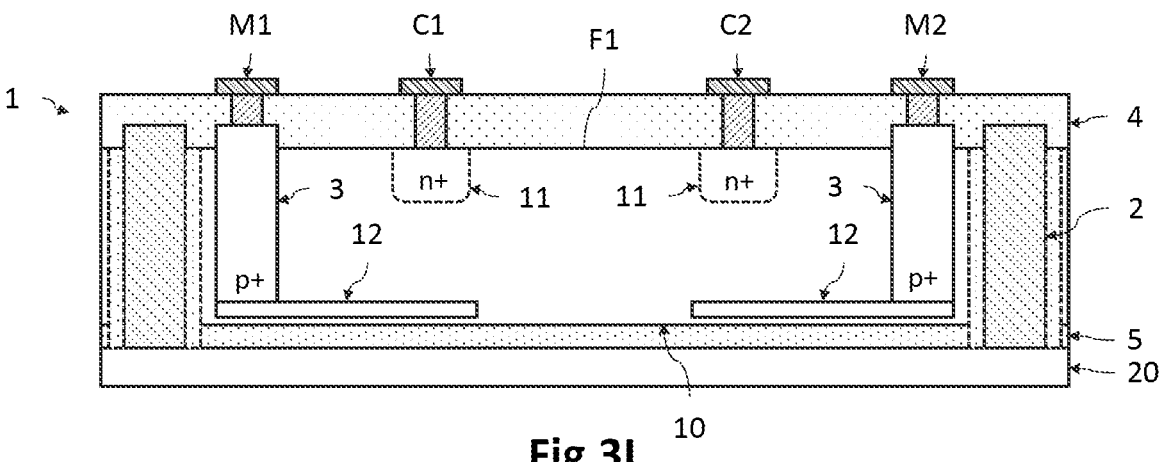

With reference to FIG. 3L, the modulation electrodes M1, M2 that extend through the dielectric passivation layer 4 and come into contact with the conductive vias 3, as well as the collection electrodes C1 and C2 that extend through the dielectric passivation layer 4 and come into contact with the upper doped regions 11, are produced.

An array of current-assisted photonic demodulators 1 is thus obtained, here in a planar configuration, which is adapted to detect in the near infrared with a cutoff wavelength greater than 1.55 μm, and which has a dark current between the doped modulation region and the adjacent doped collection region, on account of the vertical arrangement thereof and vertical compressive mechanical stress.

Particular embodiments have just been described. Various variations and modifications will be obvious to a person skilled in the art.

The invention claimed is:

1. A current-assisted photonic demodulator configured to detect light radiation of interest, including:

a detection portion, having a first face and a second face opposite one another and parallel with a main plane, and including a central incident light radiation detection zone, made of a first crystalline semiconductor material comprising germanium, including doped regions, of which:

at least two p-doped modulation regions, intended to generate and modulate a drift current in the detection portion;

at least one n-doped collection region, intended to collect the minority charge carriers photogenerated during the absorption of the light radiation of interest;

a dielectric passivation layer, produced from an electrically insulating material, and covering the first face;

electrodes located at the first face and passing through the dielectric passivation layer, of which modulation electrodes are in electrical contact with the at least two p-doped modulation regions;

and at least one collection electrode is in electrical contact with at least the one n-doped collection region;

a peripheral lateral portion, surrounding the detection portion in the main plane, produced from a second material having a coefficient of thermal expansion less than that of the first material, the detection portion then having tensile mechanical stress in the main plane and compressive mechanical stress in a vertical axis orthogonal to the main plane;

wherein said doped regions are disposed according to a vertical arrangement such that:

at least one upper region, doped according to a first type of conductivity, is flush with the first face and is located within the central zone;

at least two lower regions, doped according to a second type of conductivity opposite the first type, are located at a distance along the vertical axis from the at least one upper doped region.

2. The photonic demodulator according to claim 1, wherein each lower doped region extends parallel with the main plane towards the central zone and the at least one upper doped region, and has a distal end distant from the central zone and a proximal end oriented towards the central zone.

3. The photonic demodulator according to claim 1, including conductive vias extending along the vertical axis of the first face and in electrical contact with the at least two lower doped regions.

4. The photonic demodulator according to claim 3, wherein the conductive vias are distinct from the peripheral lateral portion.

5. The photonic demodulator according to claim 3, wherein the modulation electrodes in electrical contact with the upper doped modulation regions are closer to the central zone than electrodes in contact with the conductive vias.

6. The photonic demodulator according to claim 3, wherein the conductive vias are parts, mutually distinct, of the peripheral lateral portion, and made of an electrically conductive material.

7. The photonic demodulator according to claim 1, wherein the at least two lower doped modulation regions comprise only two lower doped modulation regions, and wherein the at least one upper doped collection region comprises only a single upper doped collection region, located in the central zone and at a distance, in the main plane, of the two lower doped modulation regions.

8. The photonic demodulator according to claim 1, wherein the at least one upper doped region comprises two upper doped regions, each being located perpendicular to one of the at least two lower doped regions.

9. The photonic demodulator according to claim 1, wherein, for an upper doped region and a vertically adjacent lower doped region, a vertical distance, along the vertical axis, between said doped regions is less than a horizontal distance, in the main plane, between one of the electrodes that is connected to the upper doped region and another one of the electrodes that is connected to the conductive via of the adjacent lower doped region.

10. The photonic demodulator according to claim 1, wherein the at least one upper doped region is a collection regions, and the at least two lower doped regions are modulation regions.

11. The photonic demodulator according to claim 1, wherein the peripheral lateral portion is produced from silicon, and the detection portion includes a lateral zone produced from SiGe, located at the interface with the peripheral lateral portion.

12. The photonic demodulator according to claim 1, wherein the at least two lower doped regions are closer to the second face than the first face.

13. A method for manufacturing the current-assisted photonic demodulator according to claim 1, including the following steps:

producing, by epitaxy from a support layer, a first layer comprising doped germanium;

producing the at least to lower doped regions by localised etching of the first layer comprising doped germanium;

producing by epitaxy a main layer comprising non-intentionally doped germanium, on or in contact with the lower doped regions;

producing a trench through the main layer surrounding the detection portion;

producing the peripheral lateral portion in the trench, at a temperature greater than ambient temperature, such that, after returning to ambient temperature, the detection portion is tensile in the main plane and compressive along the vertical axis;

producing the at least one upper region in the detection portion;

depositing the dielectric passivation layer on the detection portion;

producing the modulation electrodes and the at least one collection electrode.

14. The manufacturing method according to claim 13, including, before producing the trench, a step of producing two first notches opening onto the at least two lower doped regions, followed by a step of producing conductive vias in the first notches.

15. The manufacturing method according to claim 13, such that, when producing the trench, the trench opens onto the at least two lower doped regions, in such a way that the peripheral lateral portion is then in contact with the at least two lower doped regions.

16. The manufacturing method according to claim 13, wherein the at least one upper doped region is produced by localised ion implantation.

* * * * *